United States Patent [19]

Rennick et al.

[11] 4,232,381

[45] Nov. 4, 1980

[54] NOISE CANCELLATION USING TRACKING FILTER

[75] Inventors: Lyle V. Rennick, Mission Viejo; Julian W. Macias, Irvine, both of Calif.

[73] Assignee: Northrop Corporation, Hawthorne, Calif.

[21] Appl. No.: 47,377

[22] Filed: Jun. 8, 1979

[51] Int. Cl.[3] .................. H04B 1/06

[52] U.S. Cl. .................. 367/135; 367/901; 179/1 P

[58] Field of Search .................. 367/901, 135; 179/1 P

[56] References Cited

U.S. PATENT DOCUMENTS 3,071,752 1/1963 Strasberg .................. 367/135

3,599,142 8/1971 Rust .................. 367/135

*Primary Examiner*—Richard A. Farley

*Attorney, Agent, or Firm*—William W. Rundle; Willard M. Graham

[57] ABSTRACT

A noise-cancellation scheme in a system receiving acoustic information signals, where the system is carried in a vehicle having self-generated engine noise. An engine rotation sensor generates pulses driving a synchronous type filter device which passes only the engine noise frequency and its harmonics. The latter signal is then subtracted from the total input signal having information and noise combined. One filter circuit comprises a phase-locked loop with a multiplying counter whose output goes to a multiplexer having a plurality of grounded capacitors connected thereto.

19 Claims, 4 Drawing Figures

NOISE CANCELLATION USING TRACKING FILTER

BACKGROUND OF THE INVENTION

1. Field of the Invention

The present invention relates to noise elimination from acoustic signals, and more particularly, to means for cancelling variable-frequency self-generated noise from acoustic signal tracking systems.

Acoustic target seekers are in use for locating and tracking the sound of certain attacking weapons, for example. If the seeker system is in a mobile vehicle, which could be an aircraft, submarine, tank, or the like, self-generated vehicle noise interferes with target information signals. A common source of such noise is the propulsion engine of the seeker vehicle, which may be running at various speeds or idling under certain conditions. The present invention will also serve in other kinds of acoustic signal-handling systems.

2. Description of the Prior Art

A notch filter has been suggested in the past, but its frequency response would have to be so broad, due to variable engine speeds, that target frequencies would be lost.

U.S. Pat. No. 3,071,752 discloses an interference reduction apparatus wherein interference noise is prerecorded and later, in operation, played back to subtract from the total signal plus noise. This method is unsatisfactory for real-time operation.

U.S. Pat. No. 3,599,142 is for the same general purpose as the present invention, showing a control apparatus having phase-locked loops following the frequency of each interfering noise signal. The output of each phase-locked loop is treated by amplitude and phase determining means and later subtracted from a total input signal containing both information and noise. This patent system needs such amplitude and phase determining means for each frequency before the noise subtraction will work, thus adding complications.

While it is possible that more pertinent prior art exists, applicants' search is believed to have been conducted with a conscientious effort to locate and evaluate the most relevant art available at the time, but this statement is not to be construed as a representation that no more pertinent art exists.

SUMMARY OF THE INVENTION

Since the engine of the vehicle carrying the acoustic system from which the noise is to be eliminated is readily accessible, it is an object of this invention to provide a noise control making direct use of the rotational frequency of the engine. Any suitable rotation sensor can be used.

It is another object of the present invention to provide a noise cancellation system wherein only noise at the (variable) engine operating frequency and its harmonics are cancelled.

Briefly, our invention comprises a synchronous or commutating filter effectively "rotated" in synchronism with the engine whose rotation is being sensed, the total input waveform being fed to the filter input, and means for subtracting the filter output from the input waveform having both information and noise present. The commutating filter includes a group of storage capacitors respectively connected to the individual channels of a multiplexer device, which capacitors sample the input waveform so that the filter passes only the synchronous noise signals. Multiplexer control means comprise an engine rotation sensor or transducer generating an electrical pulse type signal, multiplying means to provide a number of pulses per engine revolution equal to the number of capacitors, and means for feeding these pulses to the channel selector control of the multiplexer.

DESCRIPTION OF THE PREFERRED EMBODIMENT

Figure 1:
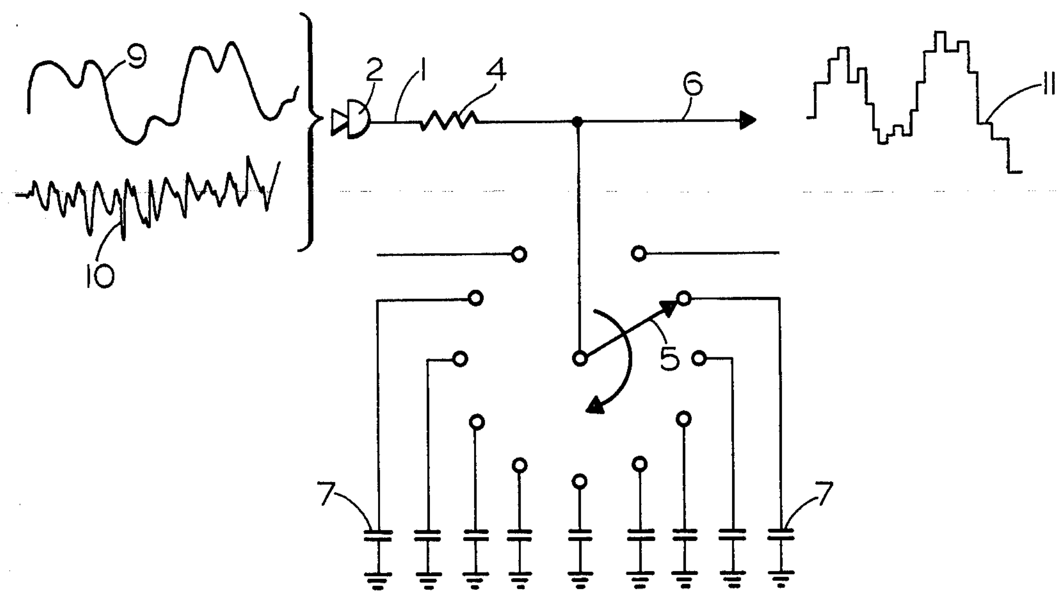
FIG. 1 is a schematic drawing showing the concept of a commutating filter.

One type of tracking or synchronous filter that is especially suitable is the commutating filter, shown conceptually in FIG. 1. Here, an input line 1 carries an acoustic signal from a microphone 2 through an input resistor 4. The output side of resistor 4 is connected to the pole of a rotatable switch 5 and to an output line 6. At each of a plurality of switch positions, a capacitor 7 is connected to ground, all capacitors being equal in capacity. If the switch 5 is made to rotate in synchronism with a given frequency in the input signal, i.e., one complete switch revolution per cycle of the given waveform, then only that frequency and its harmonics will be passed on the output line 6. Assume the input to microphone 2 is an engine sound signal 9 from a vehicle having this commutating filter therein plus a non-synchronous sound signal 10 consisting essentially of any target sound to be utilized by or operated on by a seeker system. If the output waveform 11 from such a filter is then subtracted from the total microphone input waveform, the filtered frequency and its harmonics will be very nearly cancelled out, leaving only the desired target signal. This is the basis of the present invention.

Figure 2:
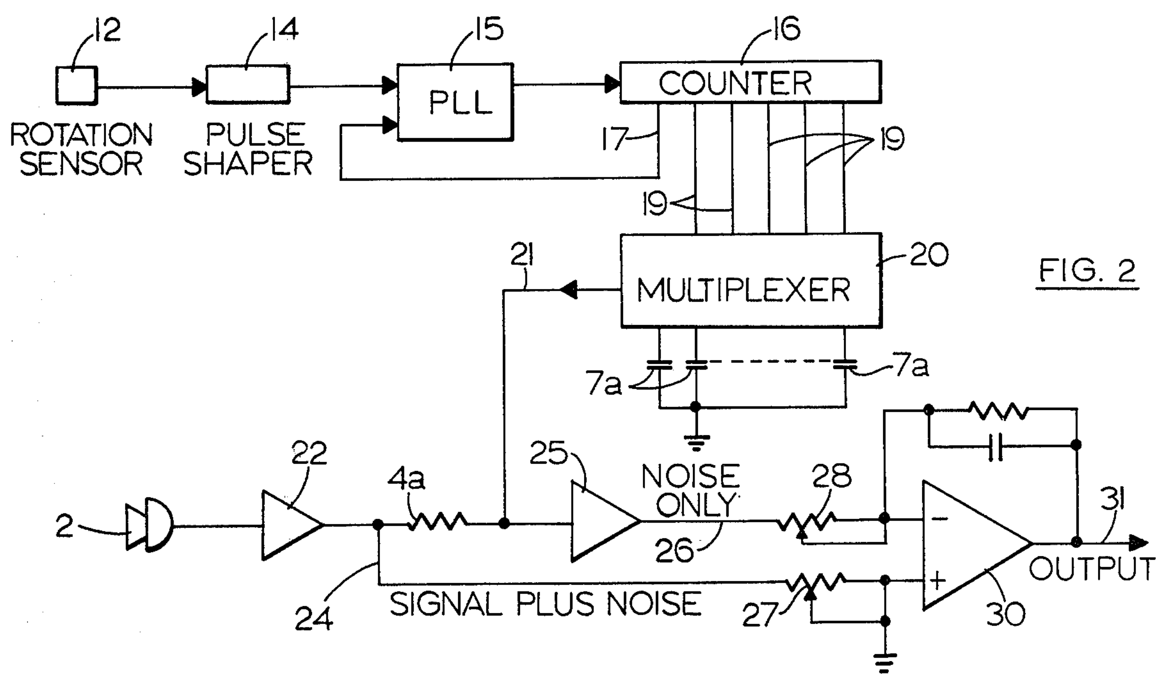
FIG. 2 is a block diagram showing a noise cancellation system according to the present invention.

One embodiment of this invention is shown in FIG. 2. A rotation sensor 12 operates directly from the engine (not shown) and generates one pulse for each engine revolution. One of the engine spark plugs may be used, for example (multiplied by two if it is a four-stroke engine), or a magnetic bar element which rotates with the engine and produces a pulse in a magnetic sensor once each revolution. The rotation pulse is preferably fed to a pulse shaper 14 to produce a suitable pulse form for the following components and/or to give a constant pulse width regardless of engine speed. For the latter purpose, a one-shot multivibrator can be used, adjusting its "on" time just so that its output will not remain "on" at the highest engine speeds to be encountered.

Next, the pulses are fed to a phase-locked loop 15 having a modulo-N binary counter 16 in the feedback loop. N is 32 in the present example. The sixth (last) stage output 17 of the counter is connected to the feedback input of the phase-locked loop 15. Thus the output of the voltage controlled oscillator in the phase-locked loop is at a frequency Nf into the counter 16, where f is the engine frequency, while the counter output 17 at its sixth stage is at frequency f.

The first five counter stage outputs form binary select lines 19 going to the control input of a 32-channel analog multiplexer 20 having a bank of 32 equal capacitors *7a* connected respectively in the channels. Each of these capacitors is grounded as in FIG. 1, the ungrounded capacitor ends being sequentially connected, one at a time, to the multiplexer output line 21, in synchronism with the phase-locked loop output frequency **32*f*. These capacitors 7*a*** may each have a capacity of 0.1 microfarad, for example.

The output of microphone 2 (FIG. 2) is amplified, if desired, by a first amplifier 22 and applied simultaneously to one end of a filter input resistor **4*a* and a first difference amplifier input line 24. The other end of resistor 4*a* is connected to a second amplifier 25 and to the multiplexer output line 21, with the output of second amplifier 25 forming a second difference amplifier input line 26. First and second difference amplifier input lines 24 and 26 preferably have level adjusting means 27 and 28 before entering the sum and difference inputs of a conventional difference amplifier 30. The signal on difference amplifier output line 31 is the output of the present invention. This is the signal with respect to ground potential, of course, since that is the common reference point to which the capacitors 7 and 7*a*** are connected.

It will be seen that the multiplexer 20, together with the filter input resistor **4*a* and grounded capacitors 7*a*, forms the commutating filter. The information signal mixed with engine noise is present at the microphone output and is passed through the first amplifier 22 to the filter input resistor 4*a* and to the first difference amplifier input line 24. At the input to the second amplifier 25 appears a filtered signal consisting of the engine noise only, due to filter operation as described above. The "noise only" then appears on the second difference amplifier input line 26. At the same time, the composite "signal plus noise" appearing on the first difference amplifier input line 24 results in the noise cancellation by the difference amplifier 30**.

Figure 3:
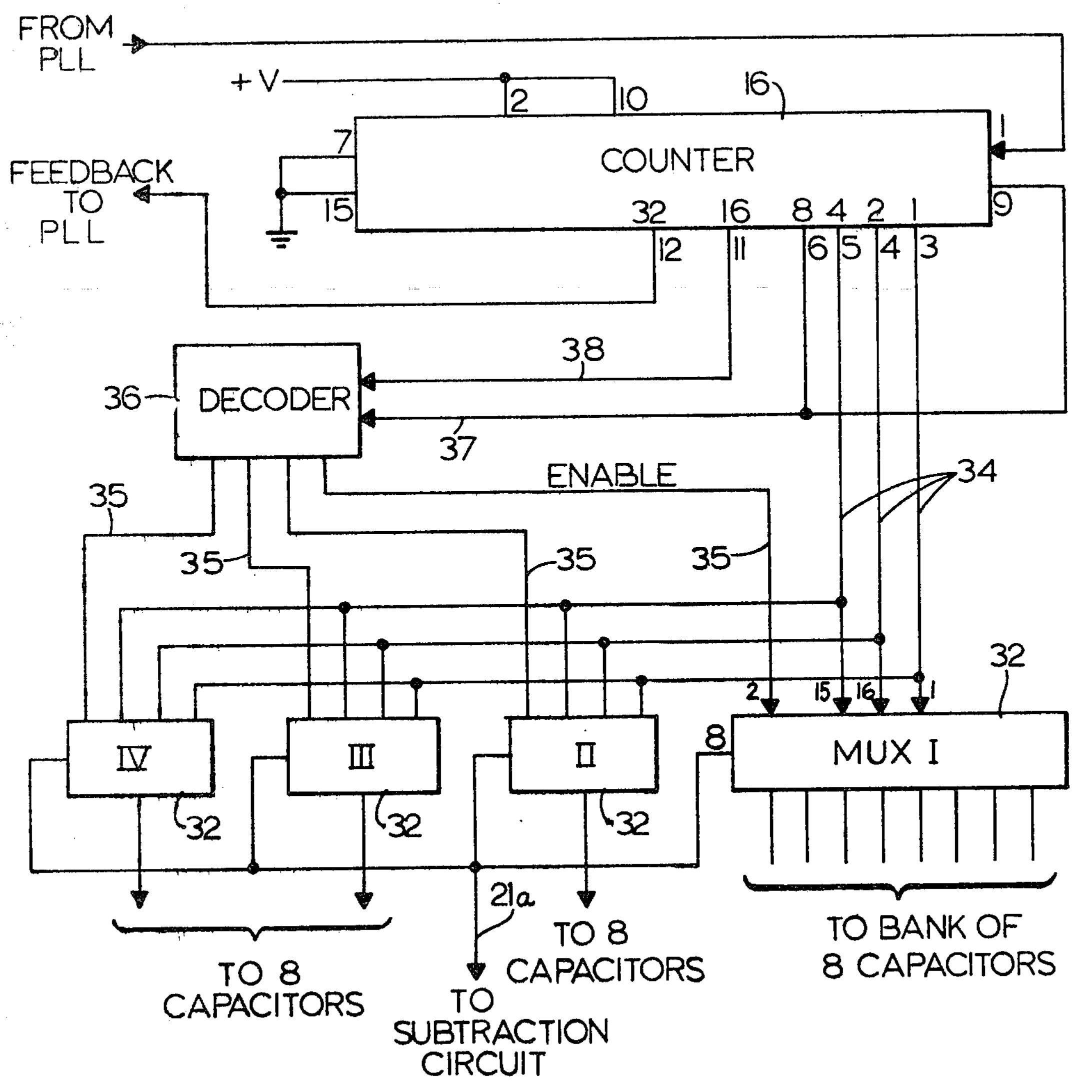
FIG. 3 is a more detailed block diagram showing a particular multiplexer arrangement for the system of FIG. 2.

The single-block multiplexer 20 may actually comprise a number of commercial integrated circuit chips as shown in FIG. 3. Here, there are four 8-line multiplexer chips 32, which may each be Siliconix type DG508 CMOS multiplexers, for example. The three binary input address lines 34 of each are connected in parallel and to the first three stage outputs, respectively, of the counter 16. An enabling line 35 of each multiplexer chip 32 comes from a conventional binary decoder 36 which is controlled through decoder input lines 36 and 37 connected from the fourth and fifth stage outputs of counter 16. The output line of each multiplexer chip 32 is connected to a common multiplexer output line **21*a* which in turn is connected to the output side of the filter input resistor 4*a* as is done in FIG. 2**.

In the circuit of FIG. 2, the phase-locked loop 15 may be a commercial type CD4046, for example. In the embodiment of FIG. 3, the counter 16 may be a commercial type CD4520, for example, and the decoder 36 may be a commercial type CD4028A, for example. These are all CMOS integrated circuits.

Figure 4:
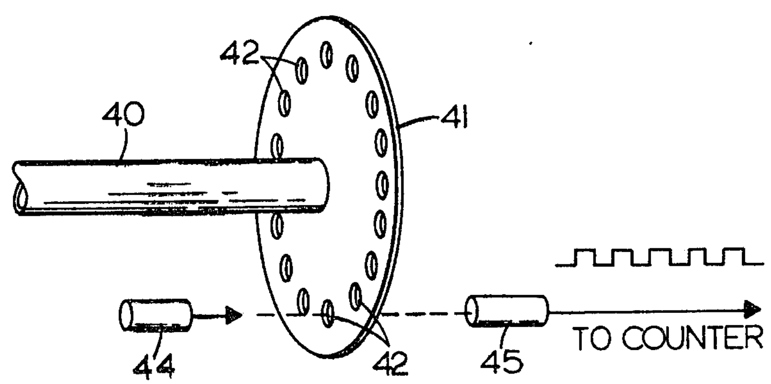
FIG. 4 is a pictorial diagram showing one alternate form of engine rotation sensor usable in the present invention.

One particular alternate form of rotation sensor 12 in FIG. 2 could be the arrangement shown in FIG. 4. Here, an engine-driven shaft 40 has attached to it an opaque shutter disc 41 with N annular apertures 42 equally spaced around the disc 41 near the rim thereof. A stationary light source 44 directs its light toward the rotating path of apertures from one side of disc 41, while a light detector 45 having an electrical output is located directly on the opposite side of the disc. Approximately 20 apertures 42 are illustrated, for example only. It will be understood that 32 openings would be provided, to fit with the example described previously where N equals 32. But obviously N could be more than 32, if desired. Thus, N pulses per revolution of shaft 40 are produced by the detector 45, and these pulses are fed to the input of the counter 16.

The multiple-pulse rotation sensor type shown in FIG. 4 is advantageous where an engine-driven shaft is accessible for such connection, since it directly provides the pulse multiplication required for the number of capacitors used in the commutating filter. When such a rotation sensor as the apertured disc 41 is used, it could eliminate the need for the phase-locked loop 15, but a pulse shaper 14 is still preferably used. The constant width of the output pulses from shaper 14 must obviously be less than the shortest anticipated period of the pulses from the rotation sensor 12. Also, there are obviously other types of rotation sensor devices which are suitable for use with the present invention.

Our invention is not restricted to use with a propulsion engine, since obviously the invention can be applied to other noise sources of an equivalent or similar nature. Although N in the example given herein is 32, it may be more or less, but for practical purposes is preferred to be at least 8. Also, while the commutating filter actual implementation herein is a solid state device, it could in some instances be a stepping switch or other mechanical movement.

Thus it is seen that an effective noise control has been provided which is simple to manufacture and use. All noise sounds which follow the engine speed frequency, plus harmonics thereof, are substantially cancelled, as long as N is sufficiently large. Of particular advantage due to the capacitive sampling process is the fact that the phase and amplitude of the unwanted noise signal need not be determined, because they are automatically correct at the output of the commutating filter. It will also be noted that additional microphone inputs can be used for a single system and do not require duplication of the rotation sensor, pulse shaper, phase-locked loop and counter components.

While in order to comply with the statute, the invention has been described in language more or less specific as to structural features, it is to be understood that the invention is not limited to the specific features shown, but that the means and construction herein disclosed comprise the preferred mode of putting the invention into effect, and the invention is therefore claimed in any of its forms or modifications within the legitimate and valid scope of the appended claims.

What is claimed is:

1. In an acoustic signal-handling system carried by a vehicle having a noise-producing engine capable of operation at various engine speeds, means for eliminating engine-related noise from the total acoustic signal received by said acoustic signal system, comprising:

a. engine rotation sensing means;

b. commutating filter means having an effective pole contact and a plurality of position contacts swept through by said pole contact during each complete cycle of its operation, a plurality of capacitor means connected at one end of each to respective ones of said position contacts and at the other end to a stable potential source;

c. means responsive to said engine rotation sensing means for effectively driving said pole contact sequentially through said position contacts at a rate of one cycle of said pole contact of each revolution of said engine;

d. microphone means exposed to the acoustic environment of said system for receiving desired signals;

e. difference circuit means having an output proportional to the difference between two separate inputs;

f. filter input resistance means having an input end and an output end;

g. means connecting the output of said microphone means to said input end of said resistance means and to one of said inputs of said difference circuit means in parallel; and h. means connected both said pole contact and said output end of said resistance means in parallel to the second said input of said difference circuit means, whereby said engine-related noise picked up by said microphone means is cancelled from the output of said difference circuit means.

2. Apparatus in accordance with claim 1 wherein said commutating filter means comprises an analog multiplexer.

3. Apparatus in accordance with claim 1 wherein said commutating filter means comprises an N-line analog multiplexer, said engine rotation sensing means comprises pulse type generating means for producing one pulse per revolution of said engine, and including a multiplier for multiplying the rate of occurrence of said pulses by N, and binary encoding means for addressing said multiplexer in accordance with the output of said multiplier.

4. Apparatus in accordance with claim 3 wherein said multiplier and said encoding means comprise a phase-locked loop and a modulo-N counter.

5. Apparatus in accordance with claim 3 wherein said multiplier and said encoding means comprise a phase-locked loop driving a modulo-N counter in the feedback of said phase-locked loop, the counter stage outputs forming address inputs to said multiplexer.

6. Apparatus in accordance with claim 1 wherein said engine rotation sensing means comprises electronic means for generating at least one pulse per revolution of said engine and including one-shot multivibrator means for giving said pulses a constant width regardless of engine speed.

7. Apparatus in accordance with claim 1 wherein said engine rotation sensing means comprises a light source and a light detector in cooperative relationship with a shutter disc between, said shutter disc having a plurality of alternate light-blocking and light-passing portions in a path crossing the line of light between said source and said detector, and means driving said shutter disc relative to said source and said detector in accordance with the speed of said engine.

8. Apparatus in accordance with claim 7 wherein said commutating filter means comprises an analog multiplexer.

9. Apparatus in accordance with claim 7 wherein said commutating filter means comprises an N-line analog multiplexer, the number of light-passing portions in said disc being equal to N, and including a modulo-N counter receiving its input from said light detector and having the output stages of said counter in driving relation to said multiplexer.

10. Means for cancelling self-generated engine noise from an acoustic information system wherein a microphone receives both desired signals and unwanted engine noise, comprising:

a. engine rotation sensing means;

b. synchronous engine-tracking filter means having a pole contact switchable through a plurality of position contacts once for each revolution of the engine in accordance with said rotation sensing means;

c. capacitor means connected from each of said position contacts, respectively, to a signal ground;

d. means for feeding the total output signal from said microphone to the input of said synchronous filter means for passing only the engine-generated noise signals; and e. means for subtracting the output of said synchronous filter means from the total microphone output signal.

11. Apparatus in accordance with claim 10 including at least eight of said filter means position contacts and capacitor means.

12. Apparatus in accordance with claim 10 wherein said synchronous filter means comprises an N-line multiplexer, and including a phase-locked loop, means for feeding one pulse per engine revolution to said phase-locked loop from said rotation sensing means, and a modulo-N counter in the feedback circuit of said phase-locked loop, the stage outputs of said counter connected to form address inputs to said multiplexer.

13. Apparatus in accordance with claim 12 wherein said pulse feeding means includes a one-shot multivibrator for producing a constant width of each pulse regardless of engine speed.

14. Apparatus in accordance with claim 10 wherein said synchronous filter means comprises an N-line multiplexer; said engine rotation sensing means comprises a light source, light detector means, and relatively movable shutter means for producing N output pulses from said detector means for each engine revolution; and coding means for feeding said detector output pulses to the address input of said multiplexer.

15. In an acoustic signal-handling system including variable-frequency self-generated noise from an engine or the like, wherein a microphone receives both desired signals and unwanted noise from said engine; means for cancelling the self-generated engine noise from said system, comprising:

a. engine rotation sensing means for producing N pulses per engine revolution;

b. N-channel multiplexing means;

c. means for feeding said pulses to the address input of said multiplexing means;

d. capacitor means connected from each channel, respectively, of said multiplexing means to a signal ground;

e. means for feeding the total output signal from said microphone to said multiplexing means; and f. means for subtracting the output of said multiplexing means from the total microphone output signal.

16. Means for removing self-generated engine-produced noise from a total waveform signal having the noise therein, comprising: synchronous filter means effectively rotated in synchronism with the engine producing said noise, means for feeding said total waveform signal to the input of said filter means, means in said filter means for passing to the output thereof only the synchronous frequencies of said total waveform, and means for subtracting the output of said filter means from said total waveform signal.

17. Apparatus in accordance with claim 16 including a plurality of storage capacitors in said filter means for repetitively sampling discrete sequential portions of said total waveform signal.

18. In an acoustic signal-handling system including self-generated noise from a variable speed engine or the like; means for cancelling said self-generated noise, comprising:

a. microphone means having a total output signal including desired signals and said self-generated noise;
b. analog multiplexer means having a common switch contact, a plurality of position contacts, and address input means for sweeping said common switch contact sequentially through said position contacts in response to pulses at said address input means;
c. a plurality of equal capacitors connected one from each said position contact to a signal ground;
d. engine rotation sensing means, and means for producing a plurality of pulses per engine revolution in accordance with said rotation sensing means, said plurality of pulses equal to said plurality of multiplexer position contacts;
e. means for feeding said pulses to said address input means for driving said multiplexer means through one complete cycle of said position contacts for each engine revolution;
f. resistance means having an input end and an output end;
g. difference circuit means having two inputs and an output proportional to the difference of said inputs;
h. the output of said microphone means connected to said input end of said resistance means; means connecting the output of said microphone means to one of said inputs of said difference circuit means;
i. said output end of said resistance means connected to said common switch contact of said multiplexer means; and means connecting said common switch contact to the second said input of said difference circuit means; whereby said self-generated engine noise is substantially eliminated from said output of said difference circuit means.

19. Apparatus in accordance with claim 18 wherein said plurality of multiplexer means position contacts equals 32.

* * * * *